United States Patent
Kim et al.

(10) Patent No.: US 8,320,168 B2
(45) Date of Patent: Nov. 27, 2012

(54) PHASE CHANGE RANDOM ACCESS MEMORY DEVICE AND RELATED METHODS OF OPERATION

(75) Inventors: Hye-jin Kim, Seoul (KR); Kwang-jin Lee, Hwaseong-si (KR); Du-eung Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 65 days.

(21) Appl. No.: 13/108,143

(22) Filed: May 16, 2011

(65) Prior Publication Data

US 2011/0213922 A1  Sep. 1, 2011

Related U.S. Application Data

(63) Continuation of application No. 12/724,679, filed on Mar. 16, 2010, now Pat. No. 7,961,504, which is a continuation of application No. 11/834,845, filed on Aug. 7, 2007, now Pat. No. 7,701,757.

(30) Foreign Application Priority Data

Aug. 31, 2006  (KR) .................... 10-2006-0083544

(51) Int. Cl.
*G11C 11/00* (2006.01)
(52) U.S. Cl. .................. 365/158; 365/171; 365/173
(58) Field of Classification Search ............... 365/158, 365/171, 173
See application file for complete search history.

(56) References Cited

U.S. PATENT DOCUMENTS

| | | | |
|---|---|---|---|
| 6,201,739 B1 | 3/2001 | Brown et al. | |
| 7,349,245 B2 * | 3/2008 | Kim et al. ................ | 365/158 |
| 7,457,151 B2 | 11/2008 | Cho et al. | |
| 7,471,553 B2 | 12/2008 | Lee et al. | |
| 2004/0228163 A1 | 11/2004 | Khouri et al. | |

FOREIGN PATENT DOCUMENTS

| | | |
|---|---|---|
| KR | 20010052795 A | 6/2001 |
| KR | 1020040104969 A | 12/2004 |
| KR | 1020050120485 A | 12/2005 |
| WO | 0062301 A1 | 10/2000 |

* cited by examiner

*Primary Examiner* — Son Dinh
*Assistant Examiner* — Nam Nguyen
(74) *Attorney, Agent, or Firm* — Volentine & Whitt, PLLC

(57) ABSTRACT

A method of operating a phase change random access memory (PRAM) device includes performing a program operation to store data in selected PRAM cells of the device, wherein the program operation comprises a plurality of sequential program loops. The method further comprises suspending the program operation in the middle of the program operation, and after suspending the program operation, resuming the program operation in response to a resume command.

19 Claims, 11 Drawing Sheets

PHASE CHANGE RANDOM ACCESS MEMORY DEVICE AND RELATED METHODS OF OPERATION

CROSS-REFERENCE TO RELATED APPLICATIONS

This application is a continuation of U.S. patent application Ser. No. 12/724,679, filed on Mar. 16, 2010, which is a continuation of Ser. No. 11/834,845, filed on Aug. 7, 2007 (now U.S. Pat. No. 7,701,757), which claims priority to Korean patent application number 10-2006-0083544, filed on Aug. 31, 2006. The collective subject matter of these applications is hereby incorporated by reference in their entirety.

BACKGROUND OF THE INVENTION

1. Field of the Invention

Embodiments of the invention relate generally to phase change random access memory (PRAM) devices and related methods of operation. More particularly, embodiments of the invention relate to PRAM devices and related methods for performing program operations.

2. Description of Related Art

Phase change memory devices store data using phase change materials, such as chalcogenide, which are capable of stably transitioning between amorphous and crystalline phases. The amorphous and crystalline phases (or states) exhibit different resistance values used to distinguish different logic states of memory cells in the memory devices. In particular, the amorphous phase exhibits a relatively high resistance and the crystalline phase exhibits a relatively low resistance.

At least one type of phase change memory device—PRAM—uses the amorphous state to represent a logical '1' and the crystalline state to represent a logical '0'. In a PRAM device, the crystalline state is referred to as a "set state" and the amorphous state is referred to as a "reset state". Accordingly, a memory cell in a PRAM stores a logical '0' by setting a phase change material in the memory cell to the crystalline state, and the memory cell stores a logical '1' by setting the phase change material to the amorphous state. Various PRAM devices are disclosed, for example, in U.S. Pat. Nos. 6,487,113 and 6,480,438.

The phase change material in a PRAM is converted to the amorphous state by heating the material to a first temperature above a predetermined melting temperature and then quickly cooling the material. The phase change material is converted to the crystalline state by heating the material at a second temperature lower than the melting temperature but above a crystallizing temperature for a sustained period of time. Accordingly, data is programmed to memory cells in a PRAM by converting the phase change material in memory cells of the PRAM between the amorphous and crystalline states using heating and cooling as described above.

The phase change material in a PRAM typically comprises a compound including germanium (Ge), antimony (Sb), and tellurium (Te), ie., a "GST" compound. The GST compound is well suited for a PRAM because it can quickly transition between the amorphous and crystalline states by heating and cooling. In addition to, or as an alternative for the GST compound, a variety of other compounds can be used in the phase change material. Examples of the other compounds include, but are not limited to, 2-element compounds such as GaSb, InSb, InSe, $Sb_2Te_3$, and GeTe, 3-element compounds such as GeSbTe, GaSeTe, InSbTe, $SnSb_2Te_4$, and InSbGe, or 4-element compounds such as AgInSbTe, (GeSn)SbTe, GeSb (SeTe), and $Te_{81}Ge_{15}Sb_2S_2$.

The memory cells in a PRAM are called "phase change memory cells". A phase change memory cell typically comprises a top electrode, a phase change material layer, a bottom electrode contact, a bottom electrode, and an access transistor. A read operation is performed on the phase change memory cell by measuring the resistance of the phase change material layer, and a program operation is performed on the phase change memory cell by heating and cooling the phase change material layer as described above.

Unfortunately, conventional PRAM devices can receive several bits of input at the same time but are unable to simultaneously program the bits into corresponding memory cells. For example, a PRAM may receive 16 inputs through a plurality of pins, but the PRAM may not be able to simultaneously access 16 phase change memory cells. One reason for this shortcoming is that if a current of 1 mA is required to program one phase change memory cell, then a current of 16 mA would be required to simultaneously program 16 phase change memory cells. Moreover, if the efficiency of a driver circuit providing the current is 10%, then in reality, a current of 160 mA would be required to simultaneously program the 16 memory cells. However, conventional PRAM devices are generally not equipped to provide currents with such high magnitudes.

Since a program driver in a PRAM device can only provide a limited amount of current, a program operation of several phase change memory cells can be divided into several "division program operations" each requiring only a fraction of the total current required to program all of the several phase change memory cells. In each division program operation, a subset (i.e., a "division") of memory cells among a larger group are programmed. For example, a group of sixteen phase change memory cells can be programmed by dividing the sixteen phase change memory cells into eight groups (i.e., divisions) of two and simultaneously programming the two memory cells in each group of two in eight successive division program operations.

To prevent unnecessary current consumption and programming failures, the PRAM device may also perform a verify read operation to verify the program status of each selected memory cell. To perform the verify read operation, program data to be programmed in the selected memory cells is stored in a temporary storage location such as a program buffer. Next, the program data is programmed into selected cells. Then, the data stored in the selected memory cells is read and compared with the program data stored in the temporary storage location. Where the data stored in the temporary storage location is different from the data stored in the selected memory cells, the verify read operation indicates a program failure. Otherwise, the verify read operation indicates a program success.

Unfortunately, in PRAM devices using division program operations, the verify read operation tends to significantly increase programming time. Accordingly, even though the verify read operation tends to improve the reliability of the PRAM devices, it can hurt the overall performance of the PRAM devices.

SUMMARY OF THE INVENTION

Selected embodiments of the invention provide phase change random access memory devices capable of performing suspend and resume operations and related methods of operation.

According to one embodiment of the invention, a method of operating a phase change random access memory device comprising a plurality of phase change random access memory cells is provided. The method comprises performing a program operation to store data in selected phase change random access memory cells among the plurality of phase change random access memory cells, wherein the program operation comprises a plurality of sequential program loops, suspending the program operation in the middle of the program operation, and after suspending the program operation, resuming the program operation in response to a resume command.

According to another embodiment of the invention, a method of operating a phase change random access memory device comprising a plurality of phase change random access memory cells divided into a plurality of cell groups is provided. The method comprises performing a program operation to store data in selected phase change random access memory cells among the plurality of phase change random access memory cells, wherein the program operation comprises a plurality of sequential program loops, wherein each of the program loops comprises a plurality of division program operations, and wherein each of the division program operations programs data into one or more of the plurality of cell groups, suspending the program operation in the middle of a current loop of the program operation, and after suspending the program operation, resuming the program operation in response to a resume command.

According to yet another embodiment of the invention, a phase change random access memory device is provided. The device comprises a plurality of phase change random access memory cells, and a programming circuit adapted to perform a program operation to program data into selected memory cells among the plurality of phase change random access memory cells using a plurality of sequential program loops, wherein the program operation is suspended in the middle of the program operation, and thereafter resumed.

According to still another embodiment of the invention, a phase change random access memory device is provided. The device comprises a plurality of phase change random access memory cells divided into a plurality of cell groups, and a programming circuit adapted to perform a program operation to program data into selected memory cells among the plurality of phase change random access memory cells using a plurality of sequential program loops, wherein each of the program loops comprises a plurality of division program operations, wherein each of the division program operations programs data into one or more of the plurality of cell groups, and wherein the program operation is suspended in the middle of the program operation, and resumed thereafter in response to a resume command.

BRIEF DESCRIPTION OF THE DRAWINGS

Embodiments of the invention are described below with reference to the corresponding drawings. In the drawings, like reference numerals refer to like features. In the drawings.

DESCRIPTION OF EXEMPLARY EMBODIMENTS

Exemplary embodiments of the invention are described below with reference to the accompanying drawings. These embodiments are presented as teaching examples while the scope of the invention is defined by the claims that follow.

Figure 1:
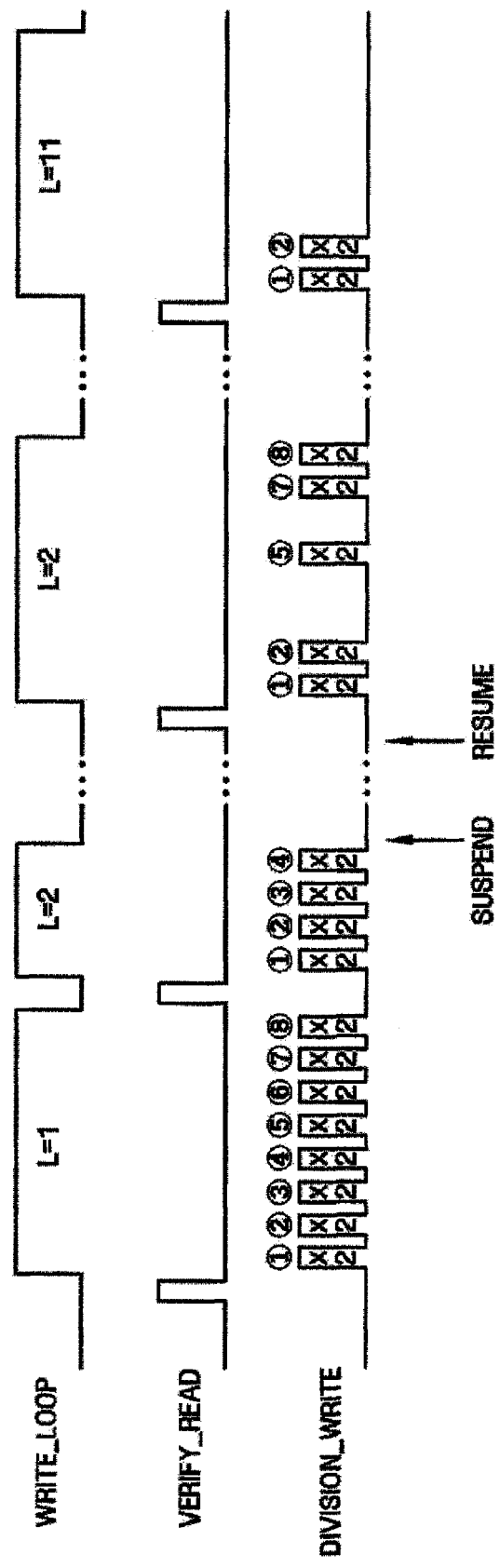
FIG. 1 is a conceptual timing chart illustrating a method of operating a PRAM device in accordance with an embodiment of the invention.

FIG. 1 is a conceptual timing chart illustrating a method of operating a PRAM device in accordance with an embodiment of the invention.

Referring to FIG. 1, a program operation is performed in the PRAM device by providing program data to the device and storing a copy of the program data for verify read operations. Next, the program data is programmed into selected phase change memory cells of the PRAM device using a plurality of program loops (L=1 through 11).

Before the start of each program loop, a verify read operation (VERIFY_READ) is performed to determine whether the selected memory cells have been successfully programmed. In each program loop, a division program operation is performed on selected memory cells that have not been successfully programmed according to the verify read operation.

For explanation purposes, it will be assumed that the program data for a program operation comprises 16 bits of data to be programmed in 16 selected memory cells divided into eight pairs. The program data is transferred to the PRAM device via 16 input/output (IO) pins and successively programmed to the eight pairs or groups in eight corresponding division program operations. As an example, Table 1 shows eight pairs taken from bits received through corresponding IO pins labeled 0 through 15. Each pair of bits can be referred to as a "division program unit".

TABLE 1

| | IO pins | | | | | | | |
|---|---|---|---|---|---|---|---|---|
| | {0, 8} | {1, 9} | {2, 10} | {3, 11} | {4, 12} | {5, 13} | {6, 14} | {7, 15} |
| Group | 1 | 2 | 3 | 4 | 5 | 6 | 7 | 8 |

For explanation purposes, it will be assumed that prior to a first program loop (L=1) of the program operation, none of the memory cells in the eight groups are successfully programmed. Accordingly, a first read verify operation before the first program loop will detect that none of the memory cells has been successfully programmed. As a result, in the first program loop, a division program operation will be performed on the memory cells in each of the first through eighth groups.

A group of memory cells where at least one memory cell has not been successfully programmed will be referred to as a "failed group". Where a group is detected to be a failed group in a verify read operation, a division program operation is performed for both memory cells in that group.

It will be assumed that a second read verify operation prior to the second loop detects that the first through fifth and seventh and eighth groups of memory cells are failed groups. Accordingly, in the second loop (L=2), a division program operation will be performed on each of these groups, denoted ①through ⑤, ⑦, and ⑧ in FIG. 1.

In the example of FIG. 1, a suspend command is input to the PRAM in the middle of the second loop after division program operations have been performed on each of the first through fourth groups in the PRAM. Later, a resume command is input to the PRAM and the second loop begins again. However, before the second loop begins again, a verify read operation is performed on the selected memory cells to detect which of the first through eighth groups are failed groups. It will be assumed that after the resume command illustrated in FIG. 1, the first, second, fifth, seventh, and eighth groups are failed groups. Accordingly, after the second loop begins again, a division program operation is performed on each of the failed groups, denoted ①, ②, ⑤, ⑦, and ⑧. Because a division program operation is not performed on the third and fourth groups after the resume command, a significant amount of power is conserved in the PRAM.

Figure 2:
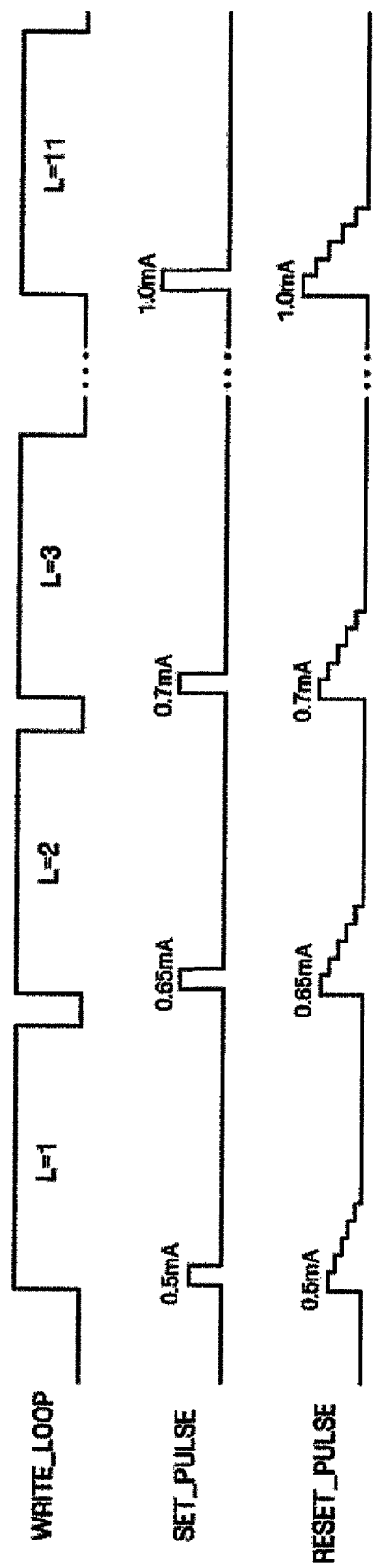
FIG. 2 is a diagram illustrating different types of set and reset pulses used to program PRAM devices in accordance with selected embodiments of the invention.

As shown in FIG. 2, the respective magnitudes of set and reset pulse currents increase in successive program loops, e.g., from 0.5 mA in the first program loop to 1.0 mA in the eleventh program loop. However, where portions of a program loop are repeated, such as the second program loop of FIG. 1, the portions of the program loop are repeated under the same conditions. For example, before and after the suspend and resume commands, the second program loop is performed with set and reset pulse currents having the magnitude 0.65 mA.

The suspend command is typically sent to the PRAM to allow a read operation to be performed within the same memory block where the program operation is being performed. The resume command is sent to the PRAM after the read operation completes. By allowing program operations to be interrupted by read operations, the average read latency of the PRAM tends to decrease.

In the embodiment illustrated in FIG. 1, eleven program loops are performed. However, the PRAM could be modified to perform fewer or more program loops.

Figure 3:
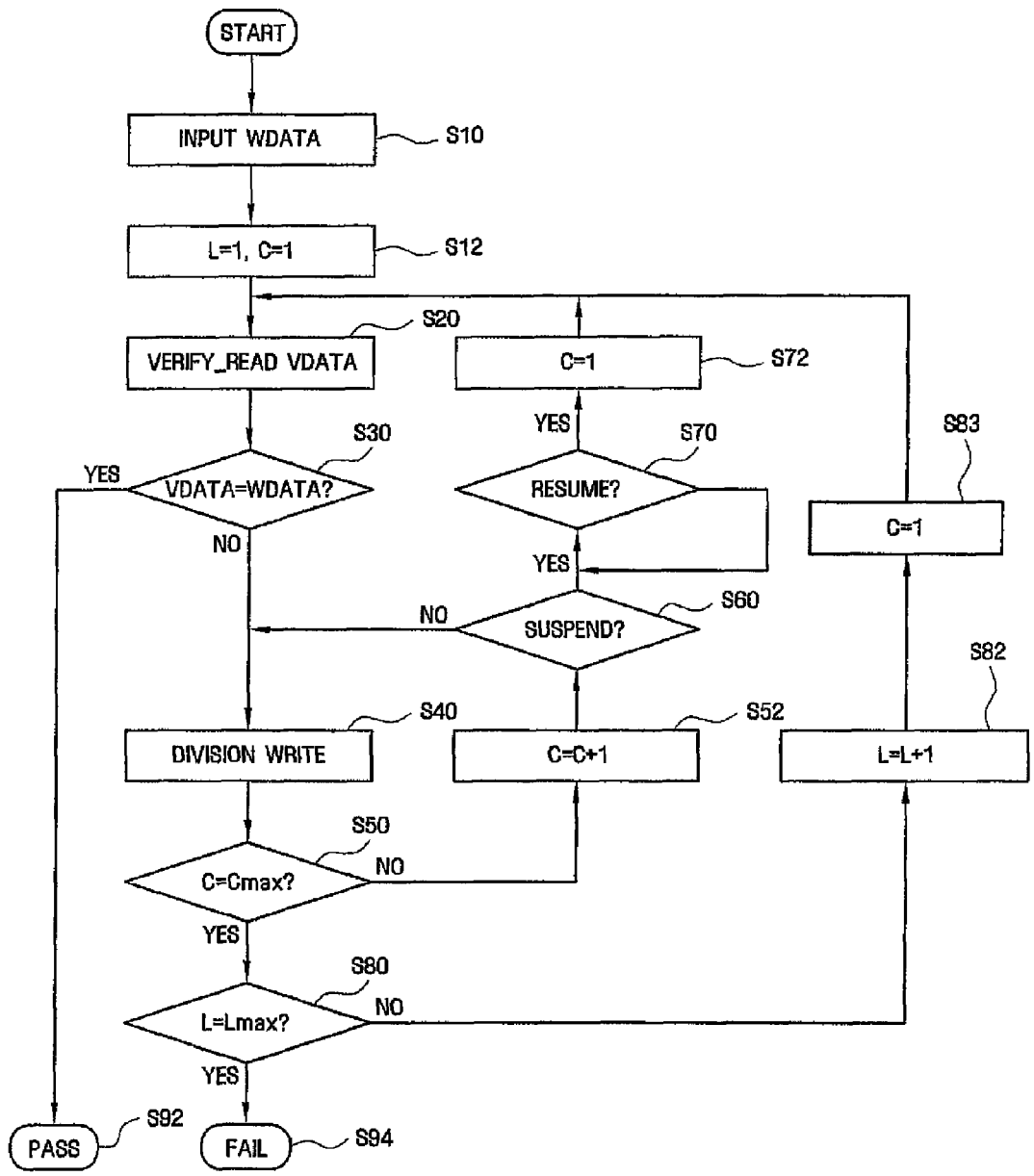
FIG. 3 is a flow chart illustrating an implementation of the method of FIG. 1.

FIG. 3 is a flowchart illustrating an implementation of the method of FIG. 1. In the description that follows, exemplary method steps are denoted by parentheses (SXX).

Referring to FIGS. 1 and 3, write data WDATA (also called "program data") to be programmed in selected memory cells of a PRAM device is input to the device (S10). Next, a program loop counter is set to L=1 and a division program operation counter is set to C=1 (S12).

Next, data stored in the selected memory cells is read out as verification data VDATA (S20). The verification data is to be used in a verify read operation (VERIFY_READ). Next verification data VDATA is compared with write data WDATA (S30). Where verification data VDATA is the same as write data WDATA (S30=Yes), the method terminates successfully (S92). Otherwise (S30=No), the PRAM performs a division program operation (labeled "division write") (S40). The division program operation is performed on a group or division of the selected memory cells corresponding to division program operation counter "C". After the division program operation, the PRAM compares division program operation counter "C" with a maximum division program count "Cmax" (S50). Where the value of division program operation counter "C" is the same as the value of maximum division program count "Cmax" (S50=Yes), the method continues to a step S80. On the other hand, where the value of division program operation counter "C" is not the same as the value of maximum division program count "Cmax" (S50=No), the method increments the value of division program operation counter "C" (S52).

After incrementing the value of division program operation counter "C", the method determines whether a suspend command has been received. Where no suspend command has been received (S60=No), the method returns to step S40. Otherwise, (S60=Yes), the method waits until a resume command is received (S70=Yes) before continuing. Upon receiving the resume command, the method resets division program operation counter "C" to one (S72) and returns to step S20.

In step S80, the method compares program loop counter "L" with a maximum program loop count "Lmax" (S80). Where program loop counter "L" is equal to maximum program loop count "Lmax" (S80=Yes), the method terminates unsuccessfully (S94). Otherwise, (S80=No), the method increments program loop counter "L" (S82), resets division program operation counter "C" to one (S83), and returns to step S20.

Figure 4:
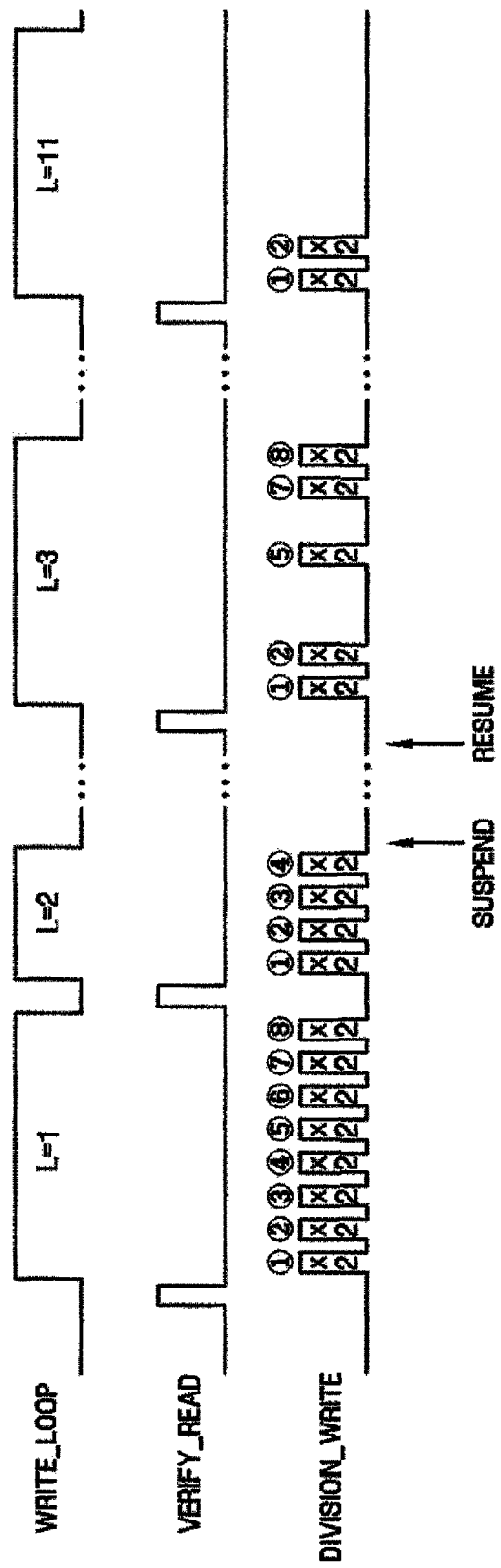
FIG. 4 is a conceptual timing chart illustrating a method of operating a PRAM device in accordance with another embodiment of the invention.
Figure 5:
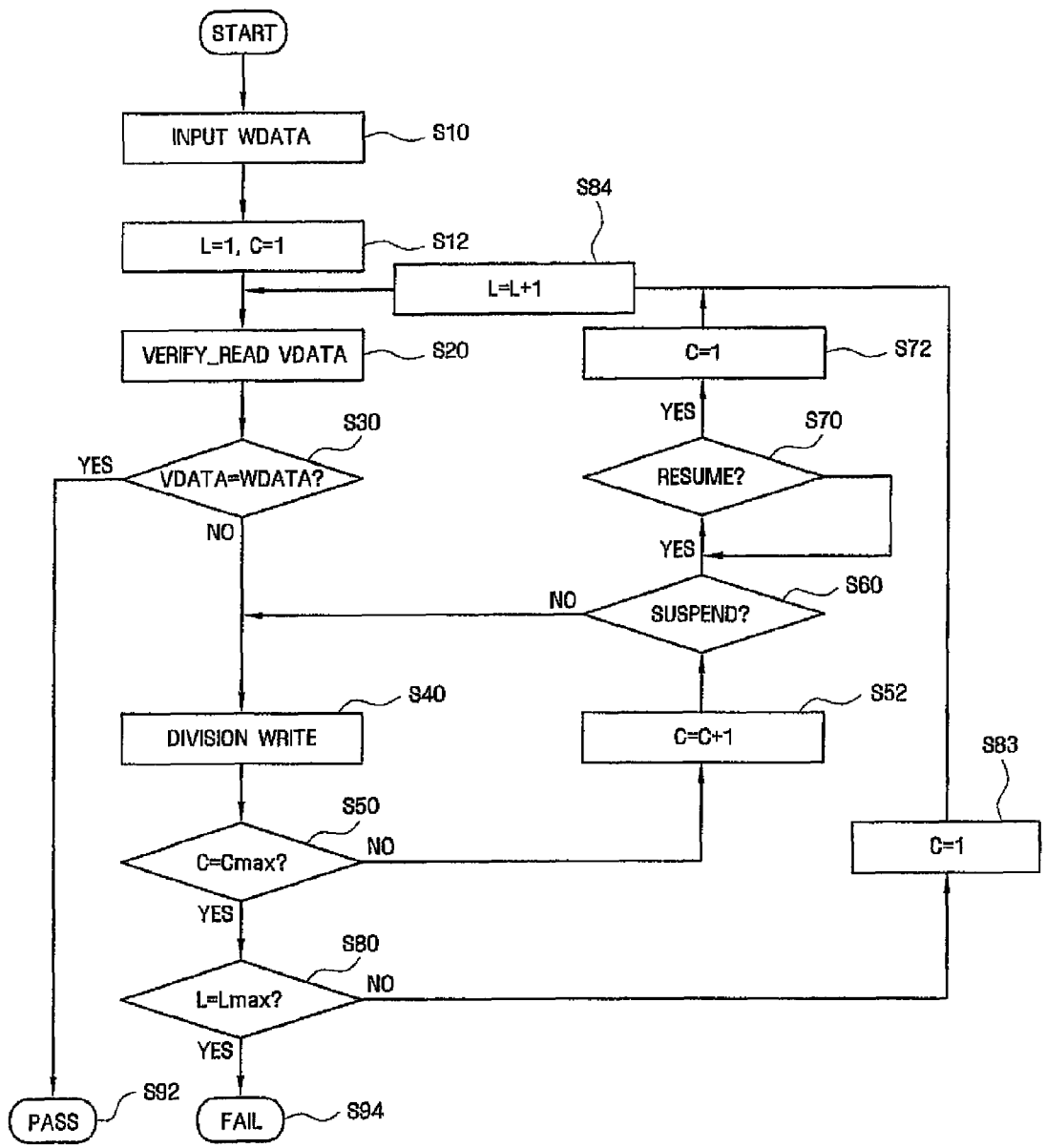
FIG. 5 is a flow chart illustrating an implementation of the method of FIG. 4.

FIG. 4 is a conceptual timing chart illustrating a method of operating a PRAM device according to another embodiment of the invention and FIG. 5 is an exemplary flowchart illustrating an implementation of the method of FIG. 4. The method of FIGS. 4 and 5 is similar to the method of FIGS. 1 and 3. Accordingly, a detailed description of steps already described with reference to FIGS. 1 and 3 will be omitted to avoid redundancy.

The method of FIGS. 4 and 5 is similar to the method of FIGS. 1 and 3, except that in the method of FIGS. 4 and 5, program loop counter "L" is incremented (S84) after suspend and resume commands are received. Accordingly, as seen in FIG. 4, after the suspend and resume commands are received, a third program loop (L=2) is performed rather than the second program loop (L=2) as illustrated in FIG. 1.

The difference between the structure shown in FIG. 5 and the structure shown in FIG. 3 will be mainly described. If the resuming command is input, the division program operation C is set to 1 again (S72), 1 is added to the program loop L (S84), and the program operation is resumed.

Figure 6:
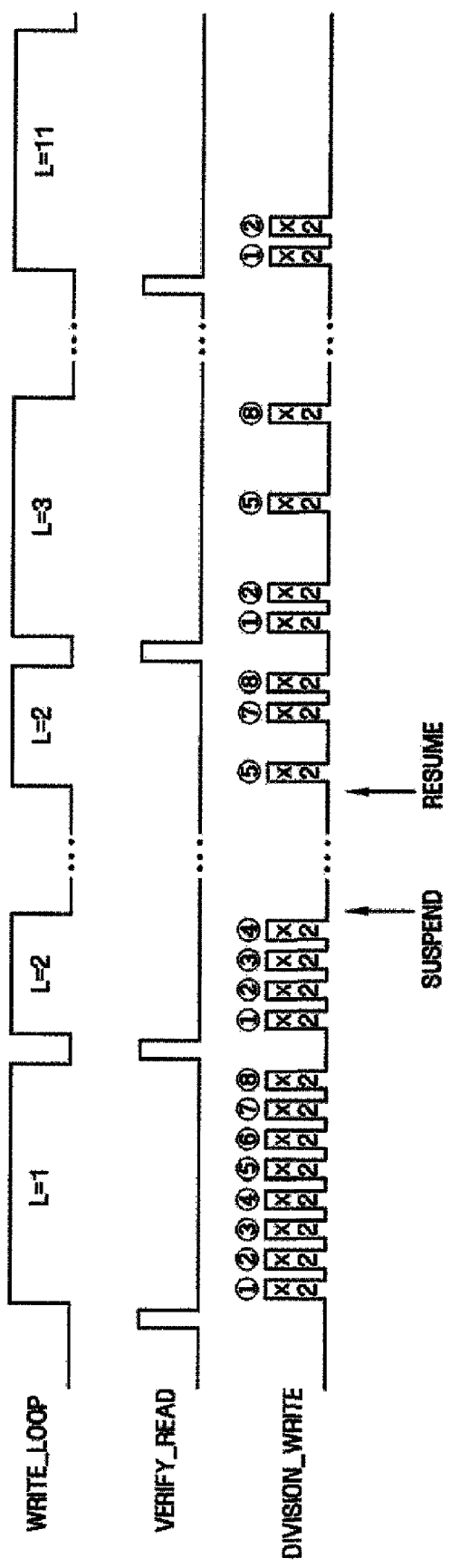
FIG. 6 is a conceptual timing chart illustrating a method of operating a PRAM device in accordance with another embodiment of the invention.
Figure 7:
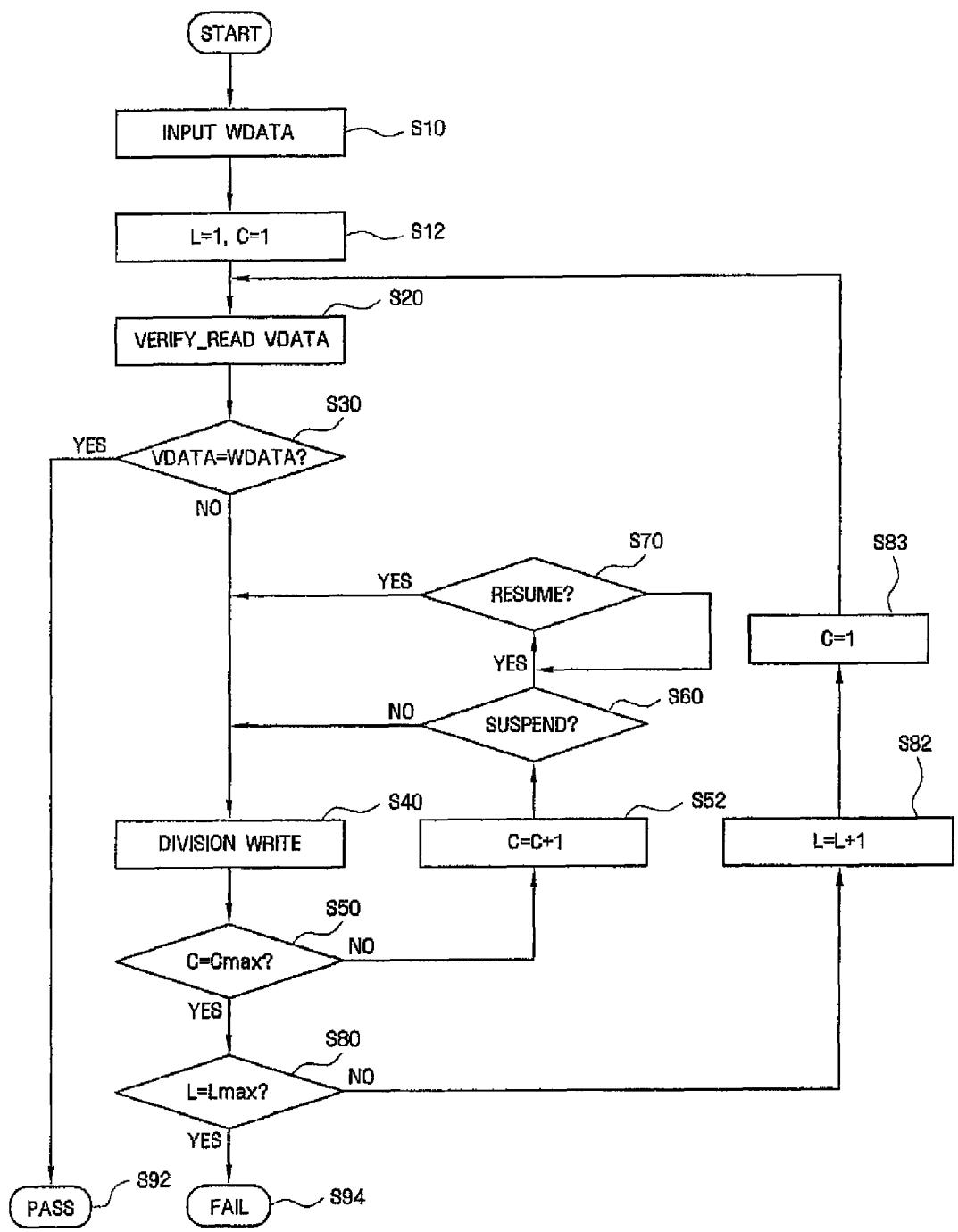
FIG. 7 is a flow chart illustrating an implementation of the method of FIG. 6.

FIG. 6 is a conceptual timing chart illustrating a method of operating a PRAM device according to another embodiment of the invention and FIG. 7 is a flowchart illustrating an implementation of the method of FIG. 6. The method of FIGS. 6 and 7 is similar to the method of FIGS. 1 and 3. Accordingly, a detailed description of steps already described with reference to FIGS. 1 and 3 will be omitted to avoid redundancy.

The method of FIGS. 6 and 7 is similar to the method of FIGS. 1 and 3, except that in the method of FIGS. 6 and 7, after a resume command is received (S70=YES), steps S72, S20, and S30 are skipped. Accordingly, where first through m-th groups of the selected memory cells are programmed before the suspend command is received (e.g., m=4 in FIG. 6), the method programs the (m+1)-th group immediately after the resume command is received. In addition, verification data VDATA is only read out and compared with write data WDATA after program loop counter "L" reaches maximum program loop count "Lmax" (S80=Yes).

Figure 8:
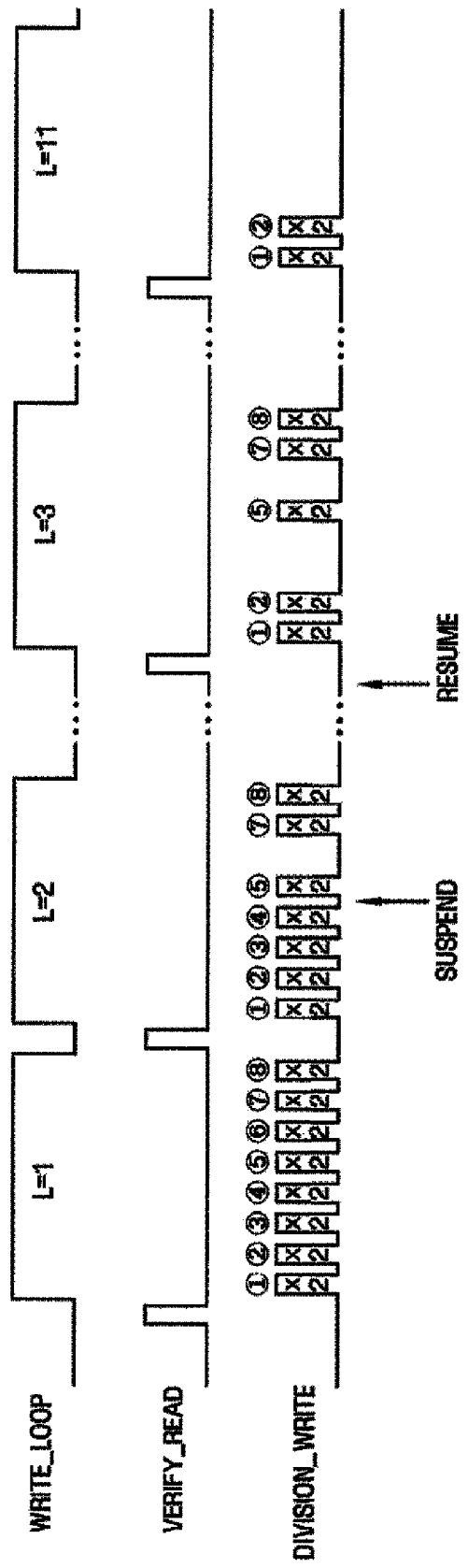
FIG. 8 is a conceptual timing chart illustrating a method of operating a PRAM device in accordance with another embodiment of the invention.
Figure 9:
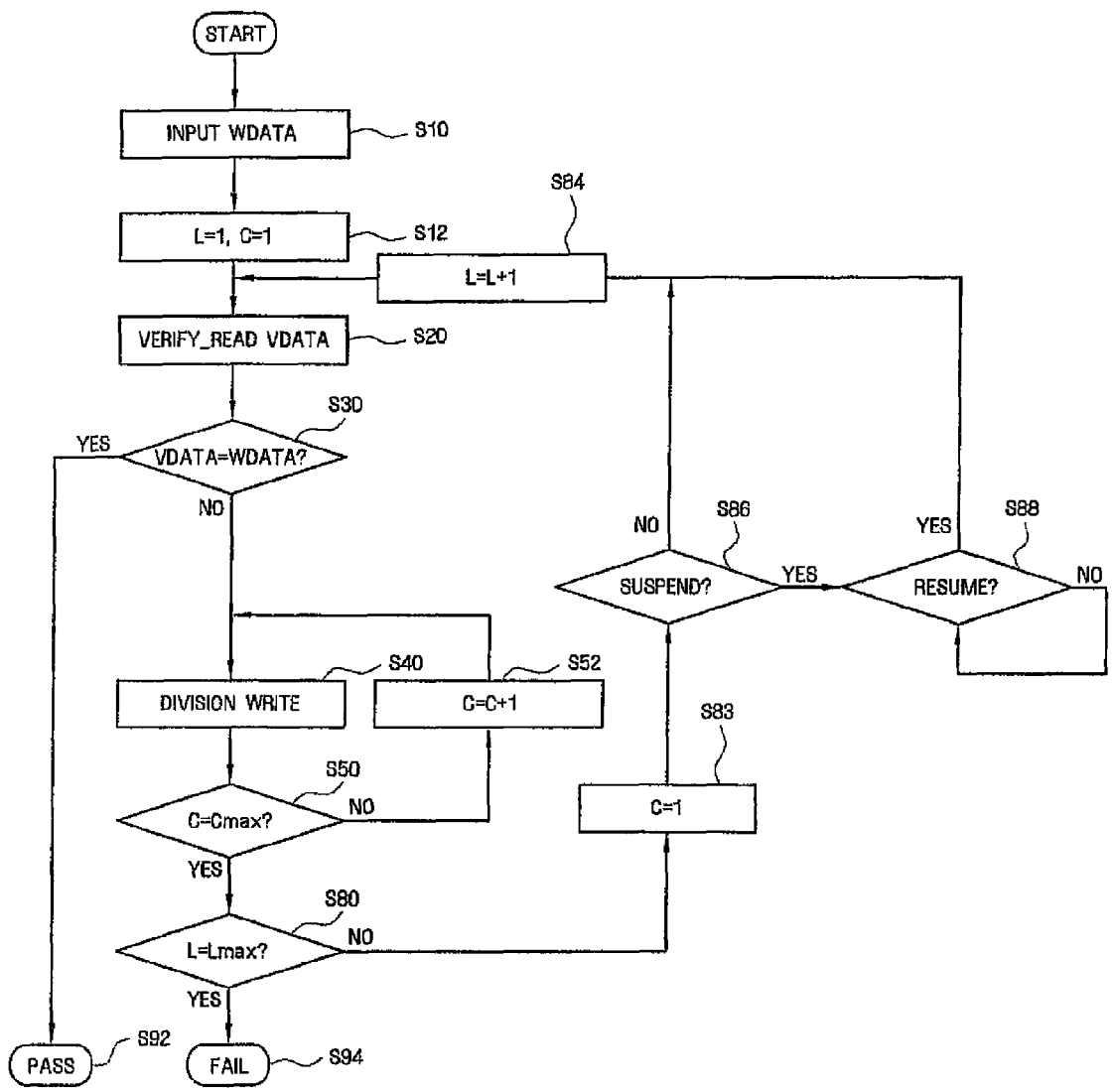
FIG. 9 is a flow chart illustrating an implementation of the method of FIG. 8.

FIG. 8 is a conceptual timing chart illustrating a method of operating a PRAM device according to another embodiment of the invention and FIG. 9 is a flowchart illustrating an implementation of the method of FIG. 9. The method of FIGS. 8 and 9 is similar to the method of FIGS. 1 and 3. Accordingly, a detailed description of steps already described with reference to FIGS. 1 and 3 will be omitted to avoid redundancy.

The method of FIGS. 8 and 9 is similar to the method of FIGS. 1 and 3, except that in the method of FIGS. 8 and 9, suspend commands are not executed until the end of a program loop. Accordingly, until division program operation counter "C" reaches maximum division program count "Cmax" (S50=YES), successive division program operations are performed (S40) and division program operation counter "C" is incremented (S52).

In the example shown in FIG. 8, the suspend command is received in the PRAM after the fourth group of the selected memory cells are programmed. However, the suspend command is not executed until after completion of the second program loop. In more general terms, in the method of FIGS. 8 and 9, if a suspend command is received during an n-th program loop, the suspend command is executed between the n-th program loop and an (n+1)-th program loop. By using the method of FIGS. 8 and 9, the stability of program operations can be improved relative to other methods such as those describe above. On the other hand, a recovery time between the receipt of the suspend command and a next command such as a read command may be increased in the method of FIGS. 8 and 9.

Figure 10:
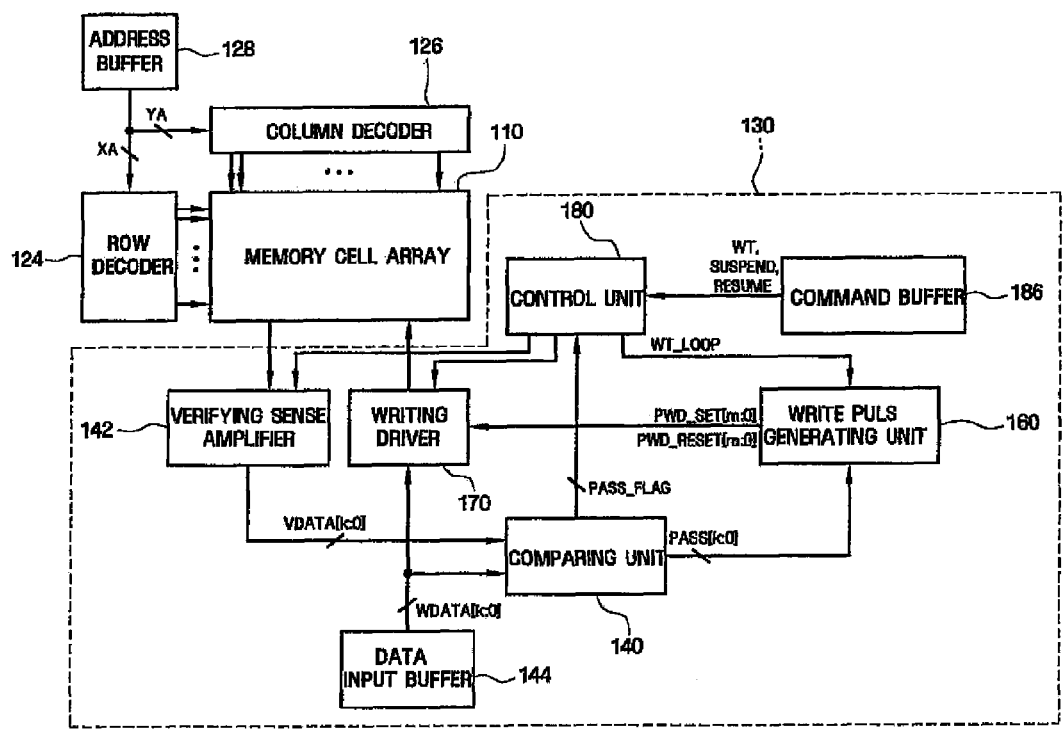
FIG. 10 is a block diagram illustrating a PRAM device in accordance with an embodiment of the invention.
Figure 11:
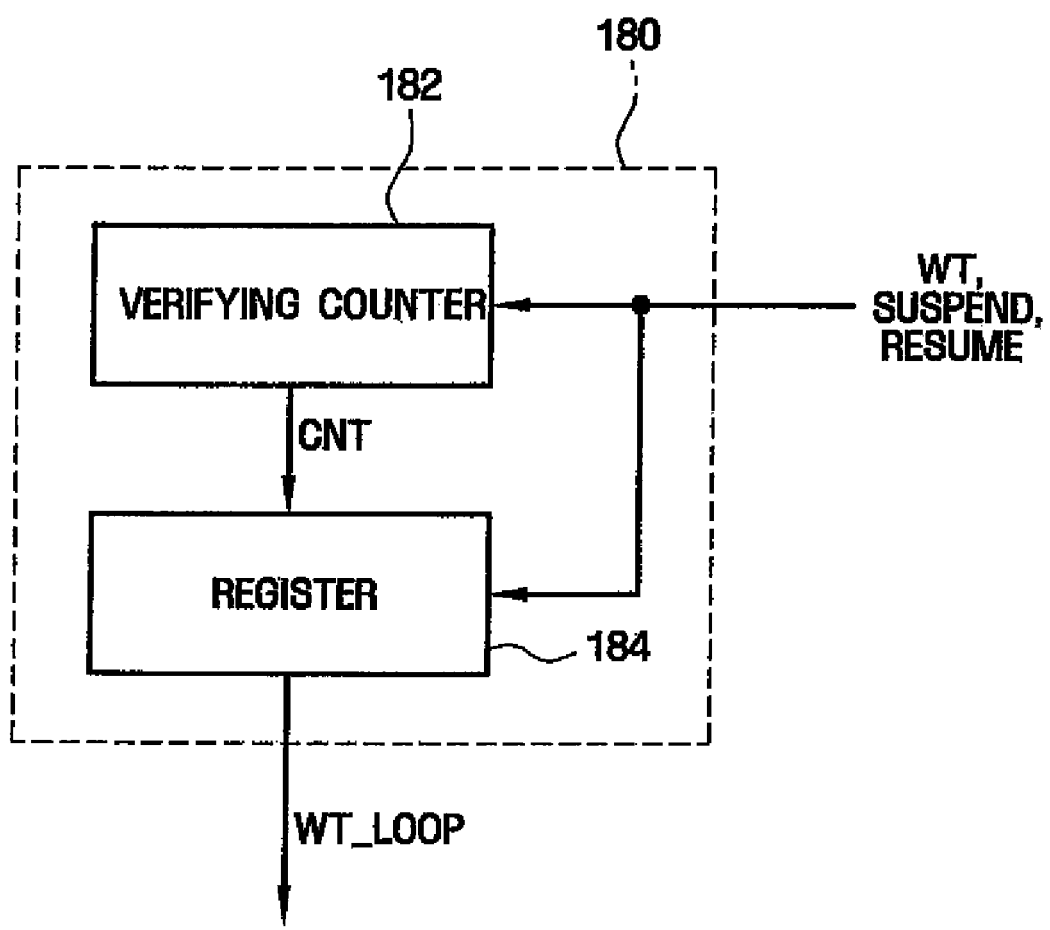
FIG. 11 is a block diagram illustrating a control unit of the PRAM in FIG. 10.

FIG. 10 is a block diagram illustrating a PRAM device according to an embodiment of the invention. The PRAM device of FIG. 10 can be adapted to implement any of the methods illustrated in FIGS. 1 through 9. FIG. 11 is an exemplary block diagram illustrating a control unit in the PRAM device of FIG. 10.

Referring to FIG. 10, the PRAM device comprises a memory cell array 110, a row decoder 124, a column decoder 126, an address buffer 128, and a programming circuit 130.

Memory cell array 110 comprises a plurality of phase change memory cells that can be divided into a plurality of cell groups. Although not shown in the drawings, each phase change memory cell comprises a phase change resistance material and an access element such as a transistor or a diode. The access element is used to control the supply of current to the phase change resistance material during program, read, and erase operations.

Row decoder 124 is provided with a row address XA output by address buffer 128, decodes row address XA, and selects a row of the plurality of phase change memory cells to be programmed. Column decoder 126 is provided with a column address YA output by address buffer 128, decodes column address YA, and selects columns of the plurality of phase change random access memory cells to be programmed based on the decoded column address YA.

Programming circuit 130 programs data in selected memory cells belonging to "failed groups" as described above. This programming is performed using a plurality of sequential program loops each divided into a plurality of division program operations. Programming circuit 30 may suspend or resume the program operation while performing the program operation. Various exemplary operations performed in relation to suspension and resumption of the program operation of programming circuit 130 are described above with reference to FIGS. 1 through 9.

In the embodiment of FIG. 10, programming circuit 130 comprises a comparing unit 140, a verifying sense amplifier 142, a data input buffer 144, a program pulse generating unit 160, a program driver 170, a control unit 180, and a command buffer 186.

Comparing unit 140 compares data verification data VDATA read from selected phase change random access memory cells by verifying sense amplifier 142 with write data WDATA input by data input buffer 144, and outputs comparison signals PASS. Comparison signals PASS indicate a plurality of different fail phase change random access memory cells [k:0] for with the corresponding verification data VDATA is different from the corresponding write data WDATA. Further, comparing unit 140 supplies a flag signal PASS_FLAG to control unit 180. Where verification data VDATA and write data WDATA are equal to each other, flag signal PASS_FLAG assumes a first level (for example, logic level "high"), and where verified data VDATA and write data WDATA are different from each other, flag signal PASS_FLAG assumes a second level (for example, logic level "low").

Control unit 180 controls verifying sense amplifier 142, program driver 170, and program pulse generating unit 160 to perform program operations. Control unit 180 receives a program command WT to enable a program loop signal WT_LOOP indicating a predetermined program loop such that data is programmed in the selected phase change random access memory cells belonging to "failed groups", and receives the suspend command to disable program loop signal WT_LOOP. Further, control unit 180 receives the resume command to re-enable program loop signal WT_LOOP. Furthermore, control unit 180 receives flag signal PASS_FLAG of the first level, and controls verifying sense amplifier 142 to suspend the program operation.

A more particular embodiment of control unit 180 is illustrated in FIG. 11 by way of example. Control unit 180 shown in FIG. 11 corresponds to a circuit block for implementing a driving method illustrated in FIGS. 1 and 3. In the example of FIG. 11, control unit 180 comprises a verifying counter 182 and a register 184. Verifying counter 182 receives program command WT to become enabled, and supplies a counting signal CNT. Verifying counter 182 receives the suspend command to become disabled, and receives the resume command to become re-enabled, and generates counting signal CNT. Resister 184 receives counting signal CNT, and generates program loop signal WT_LOOP. For example, verifying counter 182 supplies a counting signal CNT indicating 2, and register 184 stores counting signal CNT indicating 2 and supplies program loop signal WT_LOOP indicating the second program loop (L=2) using counting signal CNT. In this state, verifying counter 182 and register 184 receive a suspending command and suspends the operation. Then, if the resuming command is provided, register 184 provides program loop signal WT_LOOP indicating second program loop (L=2) by using counting signal CNT indicating 2 stored therein.

Referring again to FIG. 10, program pulse generating unit 160 receives comparing signals PASS and the write loop signals, and supplies a set pulse control signal PWD_SET and a reset pulse control signal PWD_RESET for timing the plurality of division program operations.

Program driver 170 receives write data WDATA, set pulse control signal PWD_SET, and reset pulse control signal PWD_RESET, supplies a set pulse or a reset pulse to the plurality of fail phase change random access memory cells, and programs write data WDATA.

Phase change memory random access memory device according to selected embodiments of the invention adopt division program operations and the verify read operations, but the invention is not limited thereto. For instance, in selected alternative embodiments, the division program operation could be used without the program verification operation, or both the division program operations and the program verification operations could be omitted.

As described above, in selected embodiments of the invention, phase change random access memory devices and associated systems may use division program operations and program verification operations with increased reliability relative to conventional devices and systems. Further, in order to read data stored in other memory blocks when a program operation is progressing in a predetermined memory block, the program operation in the predetermined memory block may be resumed after the program operation in the predetermined memory block is suspended and the read operation in another memory block are completed.

The foregoing exemplary embodiments are presented as teaching examples. Those skilled in art will understand that various changes in form and details can be made to the embodiments without departing from the scope of the invention as defined by the attached claims.

What is claimed is:

1. A method of operating a memory device comprising a memory cell array including a plurality of memory cells arranged in a plurality of memory blocks, the method comprising:
   programming selected memory cells of one memory block among the plurality of memory blocks by performing a program operation comprising a plurality of successive subset programs applied to respective subsets of the selected memory cells,
   suspending the program operation;
   after suspending the program operation, performing a read operation; and
   after performing the read operation, resuming the program operation.

2. The method of claim 1, wherein the read operation is directed to at least one memory cell in a memory block among the plurality of memory blocks other than the one memory block.

3. The method of claim 2, wherein the plurality of successive subset programs comprises executing at least a current program loop among a plurality of sequentially executed program loops,
   suspending the program operation comprises suspending the current program loop before completion of the current program loop; and
   resuming the program operation comprises re-executing the entire current program loop.

4. The method of claim 2, wherein the plurality of successive subset programs comprises executing at least a current program loop among a plurality of sequentially executed program loops,
   suspending the program operation comprises suspending the current program loop at a suspension point before completion of the current program loop; and
   resuming the program operation comprises executing the current program loop beginning at the suspension point.

5. The method of claim 2, wherein the plurality of successive subset programs comprises executing at least a current program loop and a next program loop following the current program loop among a plurality of sequentially executed program loops,
   suspending the program operation comprises suspending the current program loop before completion of the current program loop; and
   resuming the program operation comprises executing the next program loop without re-executing any portion of the current program loop.

6. The method of claim 2, wherein the plurality of successive subset programs comprises executing at least a current program loop among a plurality of sequentially executed program loops, and
   suspending the program operation comprises suspending the current program loop only after completion of the current program loop.

7. The method of claim 2, wherein the plurality of successive subset programs comprises executing at least a current program loop and a next program loop following the current program loop among a plurality of sequentially executed program loops,
   suspending the program operation comprises suspending the current program loop only after completion of the current program loop; and
   resuming the program operation comprises executing the next program loop only after executing the read operation.

8. The method of claim 1, wherein suspending the program operation is performed in response to a request suspension command received in the phase change random access memory.

9. The method of claim 8, wherein the phase change random access memory device further comprises a control unit configured to control execution of the program operation and a register configured to store a control data value controlling the program operation, and
   suspending the program operation comprises changing the control data value of the register in response to the received request suspension command.

10. The method of claim 1, wherein resuming the program operation is performed in response to a resume command received in the phase change random access memory.

11. The method of claim 10, wherein the phase change random access memory device further comprises a control unit configured to control execution of the program operation and a register configured to store a control data value controlling the program operation, and
   resuming the program operation comprises changing the control data value of the register in response to the received resume command.

12. The method of claim 1, wherein the read operation is directed to at least one of the selected memory cells of the one memory block.

13. The method of claim 12, wherein suspending the program operation is performed in response to a request suspension command received in the memory device.

14. The method of claim 12, wherein resuming the program operation is performed in response to a resume command received in the memory.

15. A memory device comprising:
   a memory cell array including a plurality of memory cells arranged in a plurality of memory blocks; and
   a control unit configured to receive a program command causing execution of a program operation directed to selected memory cells of one memory block in the plurality of memory blocks, the program operation comprising a plurality of successive subset programs applied to respective subsets of the selected memory cells, and the control unit comprising a register configured to store a control data value,
   the control unit being further configured to execute a suspend command suspending the program operation during the plurality of successive subset programs,
   execute a read command after suspending the program operation, and execute a resume command resuming execution of the program operation after executing the read command.

16. The memory device of claim 15, wherein the control data value controls execution of the program operation, and execution of the suspend command comprises changing the control data value in response to a suspend command received by the memory device.

17. The memory device of claim 16, wherein the read operation is directed to at least one memory cell in a memory block among the plurality of a memory blocks other than the one memory block.

18. The memory device of claim 15, wherein the control data value controls execution of the program operation, and execution of the resume command comprises changing the control data value in response to a resume command received by the memory device.

19. The memory device of claim 18, wherein the read operation is directed to at least one memory cell in a memory block among the plurality of a memory blocks other than the one memory block.

* * * * *